US011650238B2

(12) United States Patent
Colarossi et al.

(10) Patent No.: US 11,650,238 B2
(45) Date of Patent: May 16, 2023

(54) DELTA-DIFFERENCE AMPLIFIER CIRCUIT FOR RESTRAINT CONTROL MODULE

(71) Applicant: VEONEER US, INC., Southfield, MI (US)

(72) Inventors: Vincent Colarossi, Dearborn Heights, MI (US); Stuart Koch, West Bloomfield, MI (US); David Eiswerth, Wixom, MI (US)

(73) Assignee: VEONEER US, LLC, Southfield, MI (US)

( * ) Notice: Subject to any disclaimer, the term of this patent is extended or adjusted under 35 U.S.C. 154(b) by 1002 days.

(21) Appl. No.: 16/262,638

(22) Filed: Jan. 30, 2019

(65) Prior Publication Data
US 2020/0241063 A1 Jul. 30, 2020

(51) Int. Cl.
*G01R 31/00* (2006.01)
*H03F 3/45* (2006.01)

(52) U.S. Cl.
CPC ....... *G01R 31/005* (2013.01); *H03F 3/45475* (2013.01); *H03F 2200/129* (2013.01); *H03F 2203/45116* (2013.01); *H03F 2203/45528* (2013.01); *H03F 2203/45601* (2013.01)

(58) Field of Classification Search
CPC ..... H03F 2200/129; H03F 2203/45116; H03F 2203/45528; H03F 2203/45601; H03F 3/45475; B60R 2021/01286; B60R 21/0173; G01R 31/005; G01R 31/006
See application file for complete search history.

(56) References Cited

U.S. PATENT DOCUMENTS

| 5,081,442 | A | * | 1/1992 | Ito | B60R 21/0176 280/734 |
| 5,977,651 | A | * | 11/1999 | Ueda | B60R 21/017 180/271 |
| 2013/0035827 | A1 | * | 2/2013 | Breed | B60W 40/06 701/45 |
| 2015/0015281 | A1 | * | 1/2015 | Bogner | G01R 27/02 324/705 |

* cited by examiner

*Primary Examiner* — Son T Le
*Assistant Examiner* — Adam S Clarke
(74) *Attorney, Agent, or Firm* — Dickinson Wright PLLC

(57) ABSTRACT

A system for diagnosing a squib loop in a restraint control module. The system may include a first amplifier, a capacitor, a second amplifier. The first amplifier may have a first input connected to a first side of the squib and a second input connected to a second side of the squib. The output of the first amplifier may generate an output voltage corresponding to the voltage drop across the squib. The capacitor may be connected in series with the output of the first amplifier and the output of the first amplifier may be connected to a first side of the capacitor. The second amplifier having a first input connected to a second side of the capacitor. A second input of the second amplifier may be connected to a reference voltage. The second amplifier may be configured with a feedback loop to generate a gain output.

20 Claims, 9 Drawing Sheets

DELTA-DIFFERENCE AMPLIFIER CIRCUIT FOR RESTRAINT CONTROL MODULE

FIELD OF THE DISCLOSURE

The present application is related to a difference amplifier circuit for a restraint control module.

BACKGROUND

Duplex Firing involves the use of a single wire pair to connect two squibs to the Restraints ECU, eliminating two wires and associated connectors in the vehicle. However, the diagnosis of errors in duplex firing system can be challenging and may require advanced circuitry for detection.

BRIEF SUMMARY

An amplifier system for diagnosing squib loop resistance in presence of a high common mode voltage (power blocking circuit) in a restraint control module is provided. The system may include a first amplifier, a capacitor, a second amplifier. The first amplifier may have a first input connected to a first side of the squib and a second input connected to a second side of the squib. The output of the first amplifier may generate an output voltage corresponding to the voltage drop across the squib. The capacitor may be connected in series with the output of the first amplifier and the output of the first amplifier may be connected to a first side of the capacitor. The second amplifier having a first input connected to a second side of the capacitor. A second input of the second amplifier may be connected to a reference voltage. The second amplifier may be configured with a feedback loop to generate a gain output.

DETAILED DESCRIPTION

In the exemplary initiator design described in this application, integrated blocking circuits are included in the firing path of the squib, enabling the use of bidirectional firing current to independently control deployment at each squib. The active power blocking circuit voltage drop required the use of special precision amplifier to make the squib resistance measurement in presence of a high common mode voltage. The delta difference amplifier described in this application was established to facilitate the measurement of the voltages to support the squib resistance measurement for a duplex firing circuit.

The implementation described may be beneficial in providing an integrated solution to support duplex firing capability and squib resistance voltage measurement safety diagnostics capability for standard ignitors as well as duplex connected ignitors.

The delta difference amplifier may utilize multiple inputs and two power supplies, for example V_PWR_Amplifiers (VER=25 or VER=35) and a V_Logic_Power_Supply (VCC=3.3V or VCC=5V). The delta difference amplifier may utilize five digital control lines (VREF_Control, VCAP_Charge_B, CH0_Contol_B, CH1_Control_B), four deployment ASIC loop channels, and one analog to digital converter.

The squib resistance measurement for each individual squib load may utilize four individual measurements. Each measurement is defined as a phase of operation. So There are four phases to each individual squib load Channel.

For CH0:
 SRM CH0 Phase 1: 8 mA Delivered to V1_CH0
 SRM CH0 Phase 2: 40 mA Delivered to V1_CH0
 Calculate the SRM on CH0: R_CH0=(SRM CH0 Phase 2−SRM CH0 Phase 1)/(Delta_I*A_Diff_Amp*A_Gain_Amp)
 SRM CH0 Phase 3: 8 mA Delivered to V2_CH0
 SRM CH0 Phase 4: 40 mA Delivered to V2_CH0
 Calculate the SRM on CH0: R_CH0=(SRM CH0 Phase 3−SRM CH0 Phase 4)/(Delta_I*A_Diff_Amp*A_Gain_Amp)

For CH1:
 SRM CH1 Phase 1: 8 mA Delivered to V1_CH1
 SRM CH1 Phase 2: 40 mA Delivered to V1_CH1
 Calculate the SRM on CH1: R_CH1=(SRM CH1 Phase 2−SRM CH1 Phase 1)/(Delta_I*A_Diff_Amp*A_Gain_Amp)
 SRM CH1 Phase 3: 8 mA Delivered to V2_CH1
 SRM CH1 Phase 4: 40 mA Delivered to V2_CH1
 Calculate the SRM on CH1: R_CH1=(SRM CH1 Phase 3−SRM CH1 Phase 4)/(Delta_I*A_Diff_Amp*A_Gain_Amp)

Figure 1:
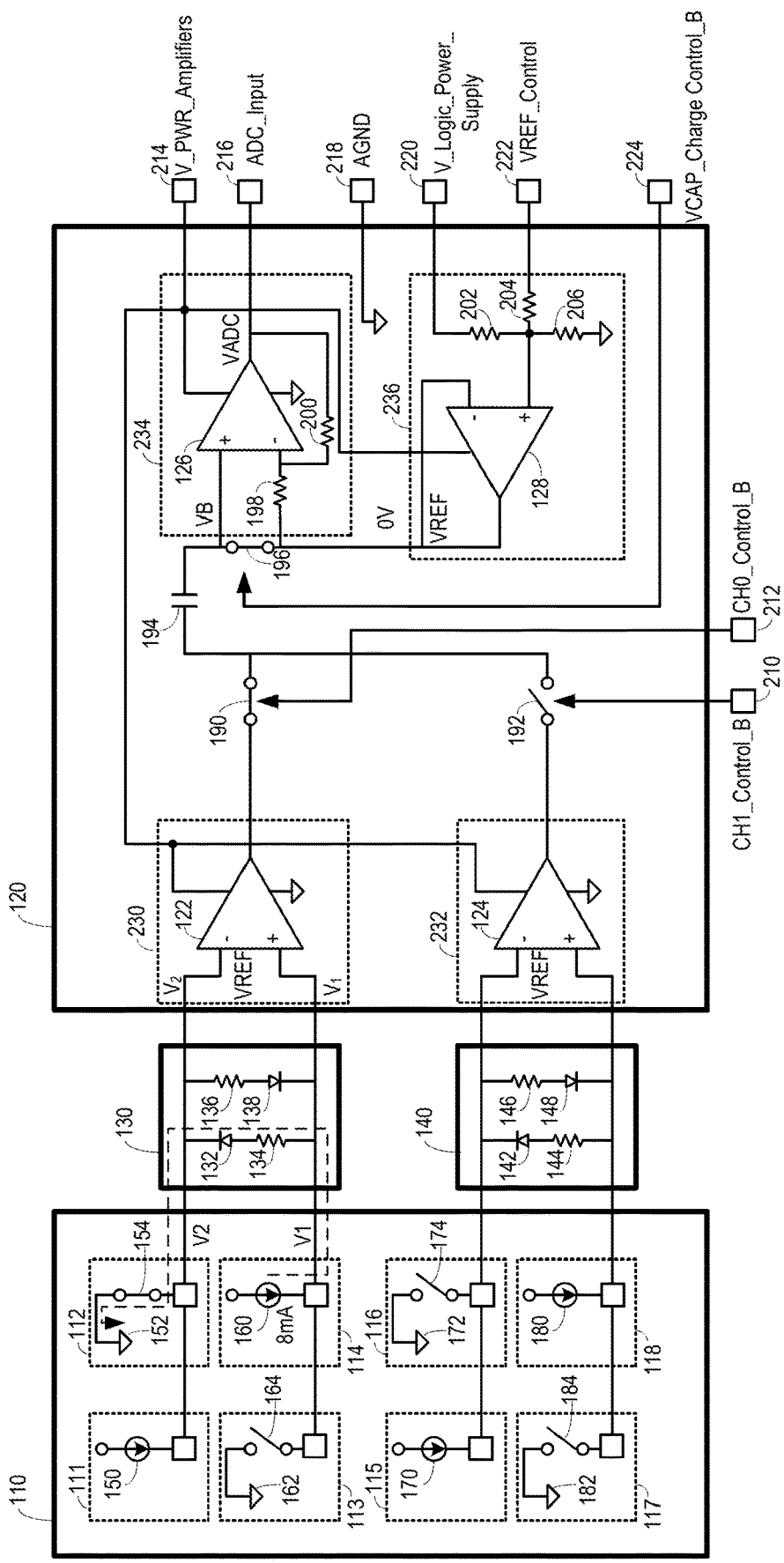
FIG. 1 is a schematic view of a system including a delta difference amplifier performing a first phase of a diagnostic.

FIG. 1 is a schematic view of a system including a delta difference amplifier performing a first phase of a diagnostic. The system may include control circuit 110, a duplex squib load 130 (channel 0), the duplex squib load 140 (channel 1), and a duplex delta difference amplifier 120. Control block 111 and control block 113 operate together to diagnose the first polarity of duplex squib load 130. Control block 112 and control block 114 operate together to diagnose the second polarity of the duplex squib load 130.

In a first phase, the first polarity of duplex squib load 130 is tested. The current source 160 may be activated to provide a diagnostic current (e.g. 8 mA) to the squib load 130. The diagnostic currently may flow from the current source 160 to resistor 134 of the duplex squib load 130. The current may flow through resistor 134 and diode 132 generating a voltage drop. The current may not flow through diode 138 and resistor 136, since the polarity of diode 138 would operate to block the current flow from current source 160. The current would flow from diode 132, through switch 154 to the ground 152. Accordingly, when current source 160 is activated, switch 154 may be closed. At the same time, switch 164 may be open to isolate current source 160 from ground 162 directly. The voltage drop across resistor 134 and diode 132 may be provided as an input to measurement amplifier 122 of difference amplifier block 230.

In this scenario, the output of amplifier 122 may be provided to switch 190. Control signal 212 may be active to cause switch 190 to close, providing the output of amplifier 122 of difference amplifier block 230 to capacitor 194. At the same time, control signal 210 may be deactivated causing switch 192 to open, isolating the output of amplifier 124 of difference amplifier block 232 from capacitor 194. Additionally, control signal 224 may be active to cause switch 196 to close. Also VREF=0V will be set by control signal 222.

Capacitor 194 may be connected between the output of amplifier 122 an input of gain amplifier 126 of output amplifier block 234. The negative input of gain amplifier 126 may be connected to the output of reference amplifier 128 through resistor 198. The negative input of gain amplifier 126 may also be connected to the output of gain amplifier 126 in a feedback loop through resistor 200. The output of gain amplifier 126 may be provided to terminal 216 as the measurement output for an analog to digital converter for diagnostic purposes.

The negative input of reference amplifier 128 of reference amplifier block 236 may be directly connected to the output of reference amplifier 128. The positive input of reference amplifier 128 may be connected to a resistor network. As such, the positive input of reference amplifier 128 may be connected to a logic power supply terminal 220 through resistor 202. The positive input of reference amplifier 128 may be connected to reference control voltage terminal 222 through resistor 204. Additionally, the positive input of reference amplifier 128 may be connected to an electrical ground through resistor 206.

Figure 2:
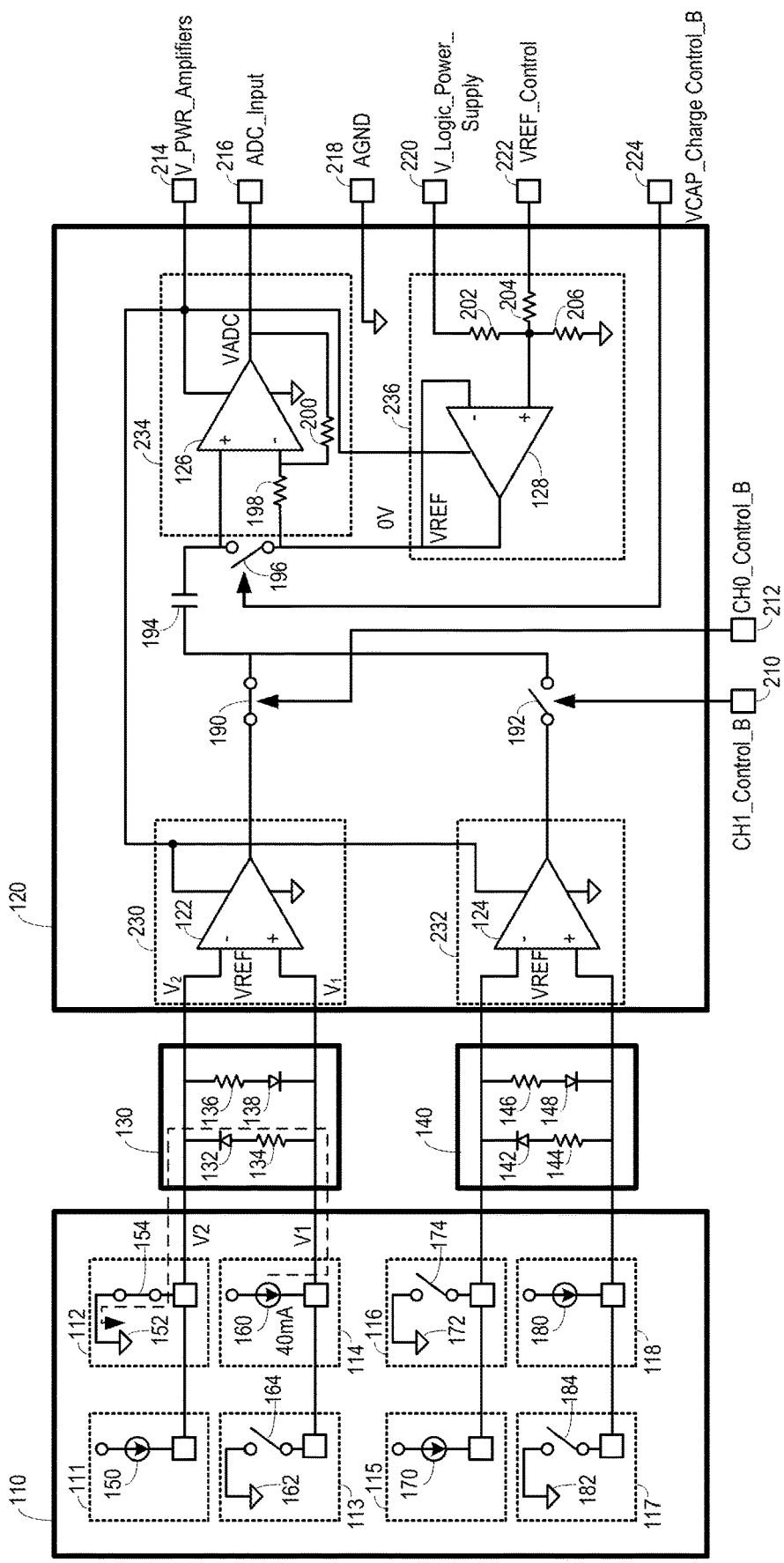
FIG. 2 is a schematic view of a system including a delta difference amplifier performing a second phase of a diagnostic.

FIG. 2 is a schematic view of a system including a delta difference amplifier performing a second phase of a diagnostic. In the second phase, the first polarity of duplex squib load 130 is tested using a different diagnostic current. The current source 160 may be activated to provide the different diagnostic current (e.g. 40 mA, which may be greater than twice or five times the first phase current.) to the squib load 130. The diagnostic currently may flow from the current source 160 to resistor 134 of the duplex squib load 130. The current may flow through resistor 134 and diode 132 generating a voltage drop. The current may not flow through diode 138 and resistor 136, since the polarity of diode 138 would operate to block the current flow from current source 160. The current would flow from diode 132, through switch 154 to the ground 152. Accordingly, when current source 160 is activated, switch 154 may be closed. At the same time, switch 164 may be open to isolate current source 160 from ground 162 directly. The voltage drop across resistor 134 and diode 132 may be provided as an input to measurement amplifier 122.

In this scenario, the output of amplifier 122 may be provided to switch 190. Control signal 212 may be active to cause switch 190 to close, providing the output of amplifier 122 to capacitor 194. At the same time, control signal 210 may be deactivated causing switch 192 to open, isolating the output of amplifier 124 from capacitor 194.

Capacitor 194 may take out the DC component of the output from amplifier 122 and provide the signal to an input of gain amplifier 126. The negative input of gain amplifier 126 may be connected to the output of reference amplifier 128 through resistor 198. The negative input of gain amplifier 126 may also be connected to the output of gain amplifier 126 in a feedback loop through resistor 200. The output of gain amplifier 126 may be provided to terminal 216 as the measurement output for an analog to digital converter for diagnostic purposes.

Figure 3:
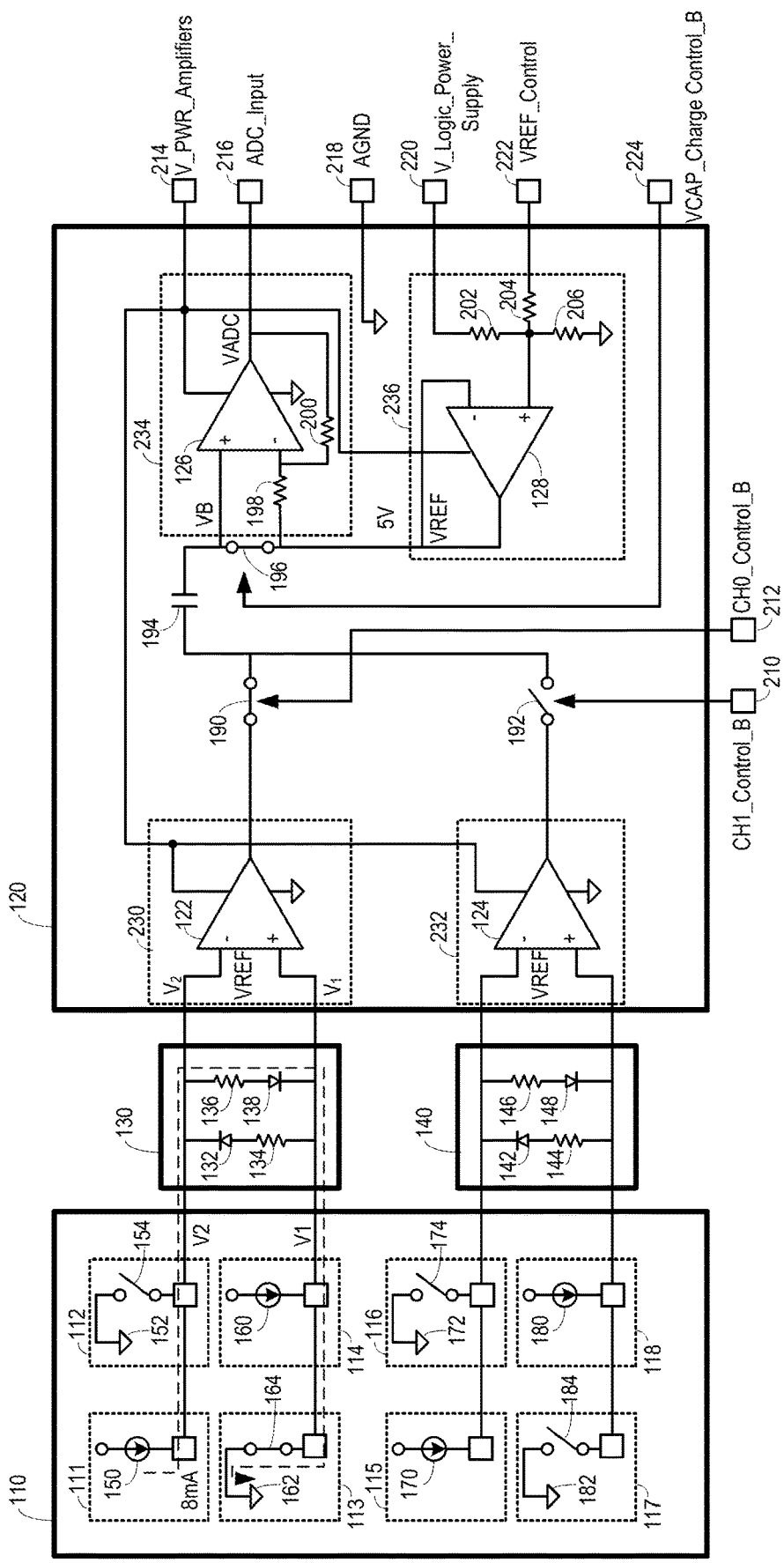
FIG. 3 is a schematic view of a system including a delta difference amplifier performing a third phase of a diagnostic.

FIG. 3 is a schematic view of a system including a delta difference amplifier performing a third phase of a diagnostic. In the third phase, the second polarity of duplex squib load 130 is tested using a diagnostic current. The current source 160 may be activated to provide the diagnostic current (e.g. 8 mA) to the squib load 130. The diagnostic currently may flow from the current source 150 to resistor 136 of the duplex squib load 130. The current may flow through resistor 136 and diode 138 generating a voltage drop. The current may not flow through diode 132 and resistor 134, since the polarity of diode 132 would operate to block the current flow from current source 150. The current would flow from diode 138, through switch 164 to the ground 162. Accordingly, when current source 150 is activated, switch 164 may be closed. At the same time, switch 154 may be open to isolate current source 150 from ground 152 directly. The voltage drop across resistor 136 and diode 138 may be provided as an input to measurement amplifier 122.

In this scenario, the output of amplifier 122 may be provided to switch 190. Control signal 212 may be active to cause switch 190 to close, providing the output of amplifier 122 to capacitor 194. At the same time, control signal 210 may be deactivated causing switch 192 to open, isolating the output of amplifier 124 from capacitor 194.

Capacitor 194 may take out the DC component of the output from amplifier 122 and provide the signal to an input of gain amplifier 126. The negative input of gain amplifier 126 may be connected to the output of reference amplifier 128 through resistor 198. The negative input of gain amplifier 126 may also be connected to the output of gain amplifier 126 in a feedback loop through resistor 200. The output of gain amplifier 126 may be provided to terminal 216 as the measurement output for diagnostic purposes.

The negative input of reference amplifier 128 may be directly connected to the output of reference amplifier 128. The positive input of reference amplifier 128 may be connected to a resistor network. As such, the positive input of reference amplifier 128 may be connected to a logic power supply terminal 220 through resistor 202. The positive input of reference amplifier 128 may be connected to reference control voltage terminal 222 through resistor 204. Additionally, the positive input of reference amplifier 128 may be connected to an electrical ground through resistor 206.

Figure 4:
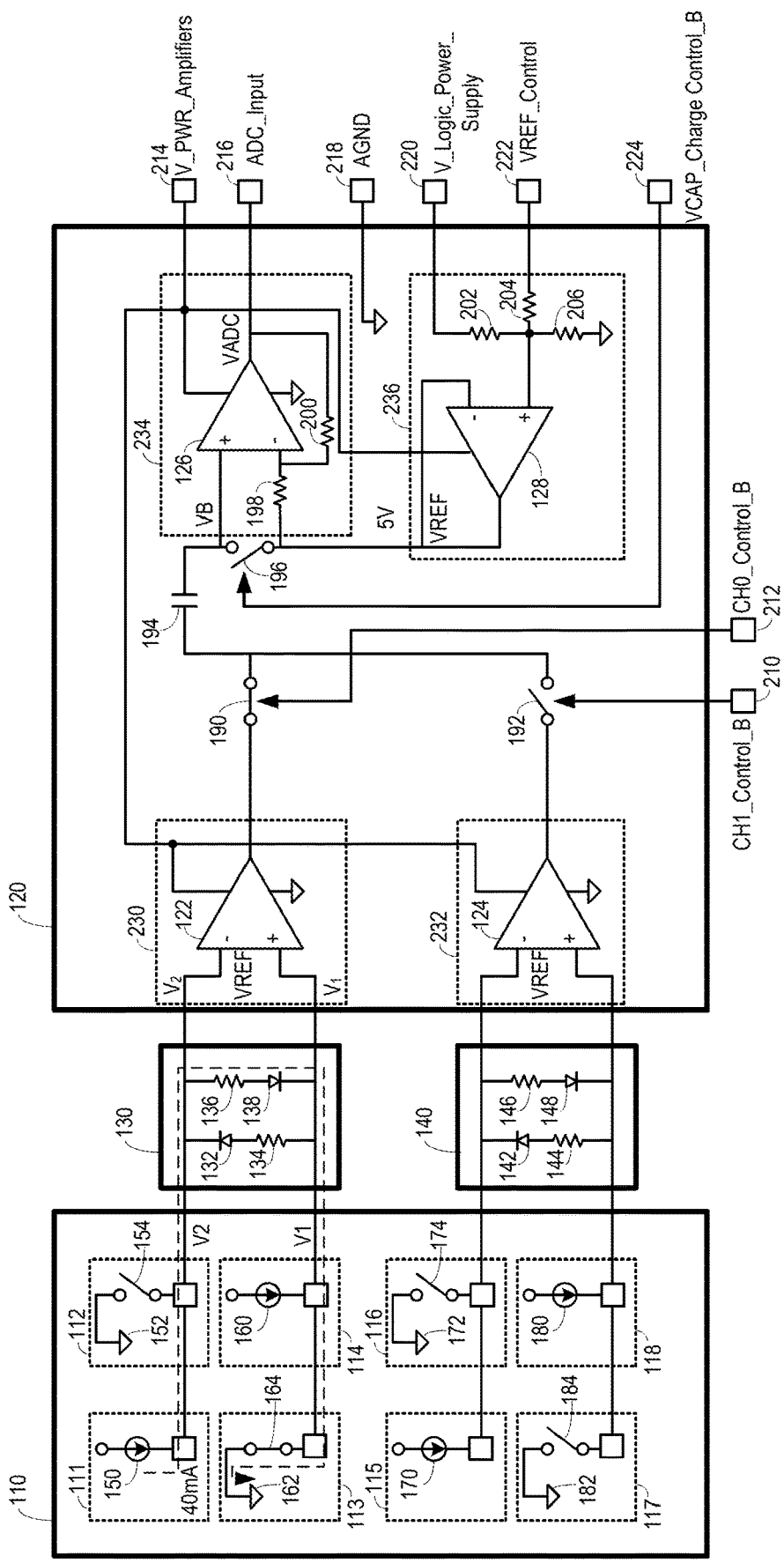
FIG. 4 is a schematic view of a system including a delta difference amplifier performing a fourth phase of a diagnostic.

FIG. 4 is a schematic view of a system including a delta difference amplifier performing a fourth phase of a diagnostic. In the fourth phase, the second polarity of duplex squib load 130 is tested using a different diagnostic current. The current source 160 may be activated to provide the different diagnostic current (e.g. 40 mA, which may be greater than twice or five times the first phase current) to the squib load 130. The diagnostic currently may flow from the current source 150 to resistor 136 of the duplex squib load 130. The current may flow through resistor 136 and diode 138 generating a voltage drop. The current may not flow through diode 132 and resistor 134, since the polarity of diode 132 would operate to block the current flow from current source 150. The current would flow from diode 138, through switch 164 to the ground 162. Accordingly, when current source 150 is activated, switch 164 may be closed. At the same time, switch 154 may be open to isolate current source 150 from ground 152 directly. The voltage drop across resistor 136 and diode 138 may be provided as an input to measurement amplifier 122.

In this scenario, the output of amplifier 122 may be provided to switch 190. Control signal 212 may be active to cause switch 190 to close, providing the output of amplifier 122 to capacitor 194. At the same time, control signal 210 may be deactivated causing switch 192 to open, isolating the output of amplifier 124 from capacitor 194.

Capacitor 194 may take out the DC component of the output from amplifier 122 and provide the signal to an input of gain amplifier 126. The negative input of gain amplifier 126 may be connected to the output of reference amplifier 128 through resistor 198. The negative input of gain amplifier 126 may also be connected to the output of gain amplifier 126 in a feedback loop through resistor 200. The output of gain amplifier 126 may be provided to terminal 216 as the measurement output for diagnostic purposes.

Figure 5:
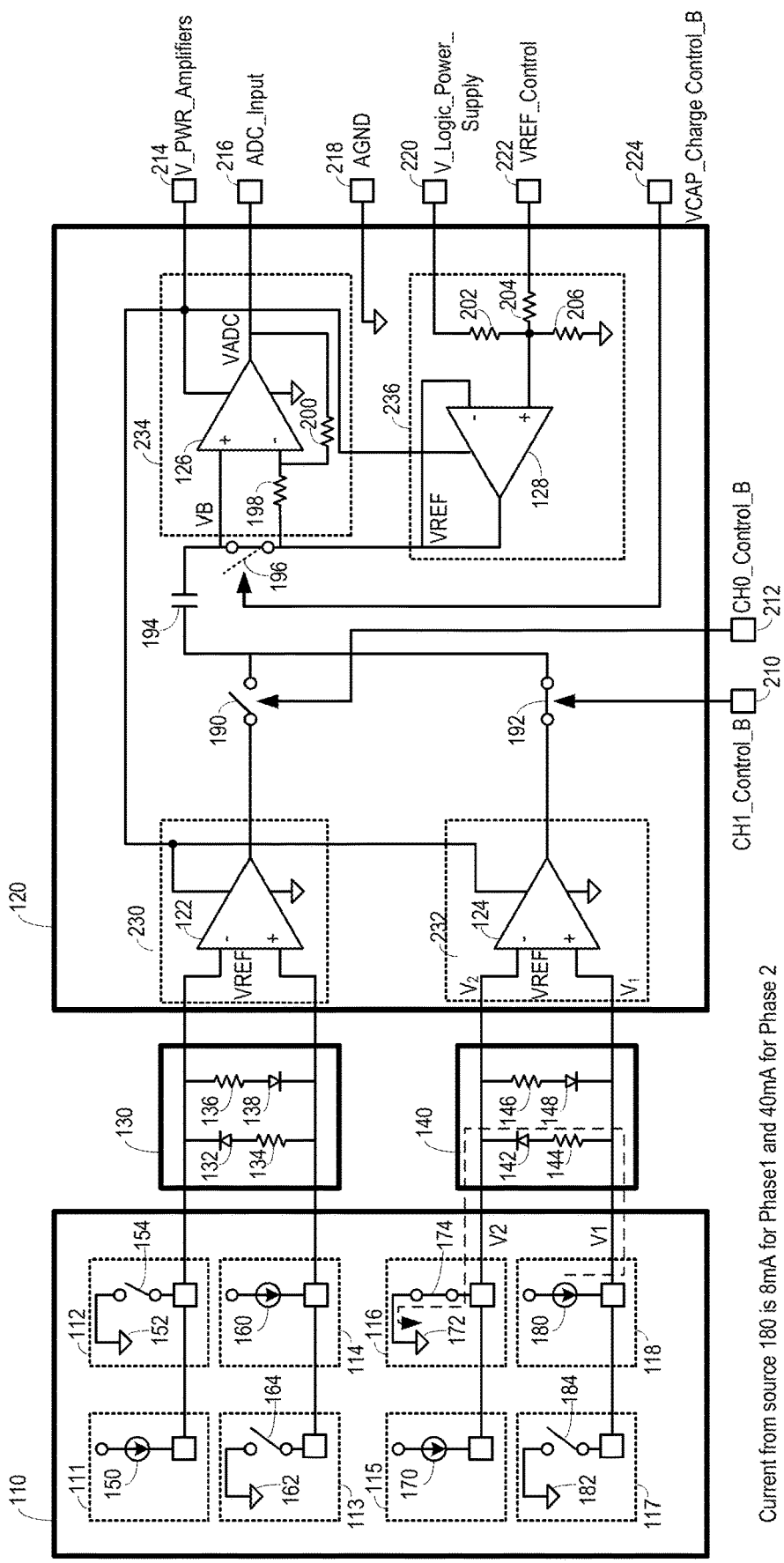
FIG. 5 is a schematic view of a system including a delta difference amplifier performing a first and second phase of a diagnostic for a second channel.

FIG. 5 is a schematic view of a system including a delta difference amplifier performing a first and second phase of a diagnostic for a second channel. In a manner similar to duplex squib load 130, duplex squib load 140 may also be tested in four phases. Control block 115 and control block 117 operate together to diagnose the first polarity of duplex squib load 140. Control block 116 and control block 118 operate together to diagnose the second polarity of the duplex squib load When testing the first polarity of duplex squib load 140, the current source 170 may be activated to provide at least two diagnostic currents (e.g. 8 mA in phase 1 and then 40 mA in phase 2) to the squib load 140. The diagnostic currently may flow from the current source 170 to resistor 146 of the duplex squib load 140. The current may flow through resistor 146 and diode 148 generating a voltage drop. The current may not flow through diode 142 and resistor 144, since the polarity of diode 142 would operate to block the current flow from current source 170. The current would flow from diode 148, through switch 184 to the ground 182. Accordingly, when current source 170 is activated, switch 184 may be closed. At the same time, switch 174 may be open to isolate current source 170 from ground 172 directly. The voltage drop across resistor 146 and diode 148 may be provided as an input to measurement amplifier 124.

In this scenario, the output of amplifier 124 may be provided to switch 192. Control signal 210 may be active to cause switch 192 to close, providing the output of amplifier 124 to capacitor 194. At the same time, control signal 212 may be deactivated causing switch 190 to open, isolating the output of amplifier 122 from capacitor 194.

Capacitor 194 may take out the DC component of the output from amplifier 124 and provide the signal to an input of gain amplifier 126. The negative input of gain amplifier 126 may be connected to the output of reference amplifier 128 through resistor 198. The negative input of gain amplifier 126 may also be connected to the output of gain amplifier 126 in a feedback loop through resistor 200. The output of gain amplifier 126 may be provided to terminal 216 as the measurement output for diagnostic purposes.

The negative input of reference amplifier 128 may be directly connected to the output of reference amplifier 128. The positive input of reference amplifier 128 may be connected to a resistor network. As such, the positive input of reference amplifier 128 may be connected to a logic power supply terminal 220 through resistor 202. The positive input of reference amplifier 128 may be connected to reference control voltage terminal 222 through resistor 204. Additionally, the positive input of reference amplifier 128 may be connected to an electrical ground through resistor 206.

Figure 6:
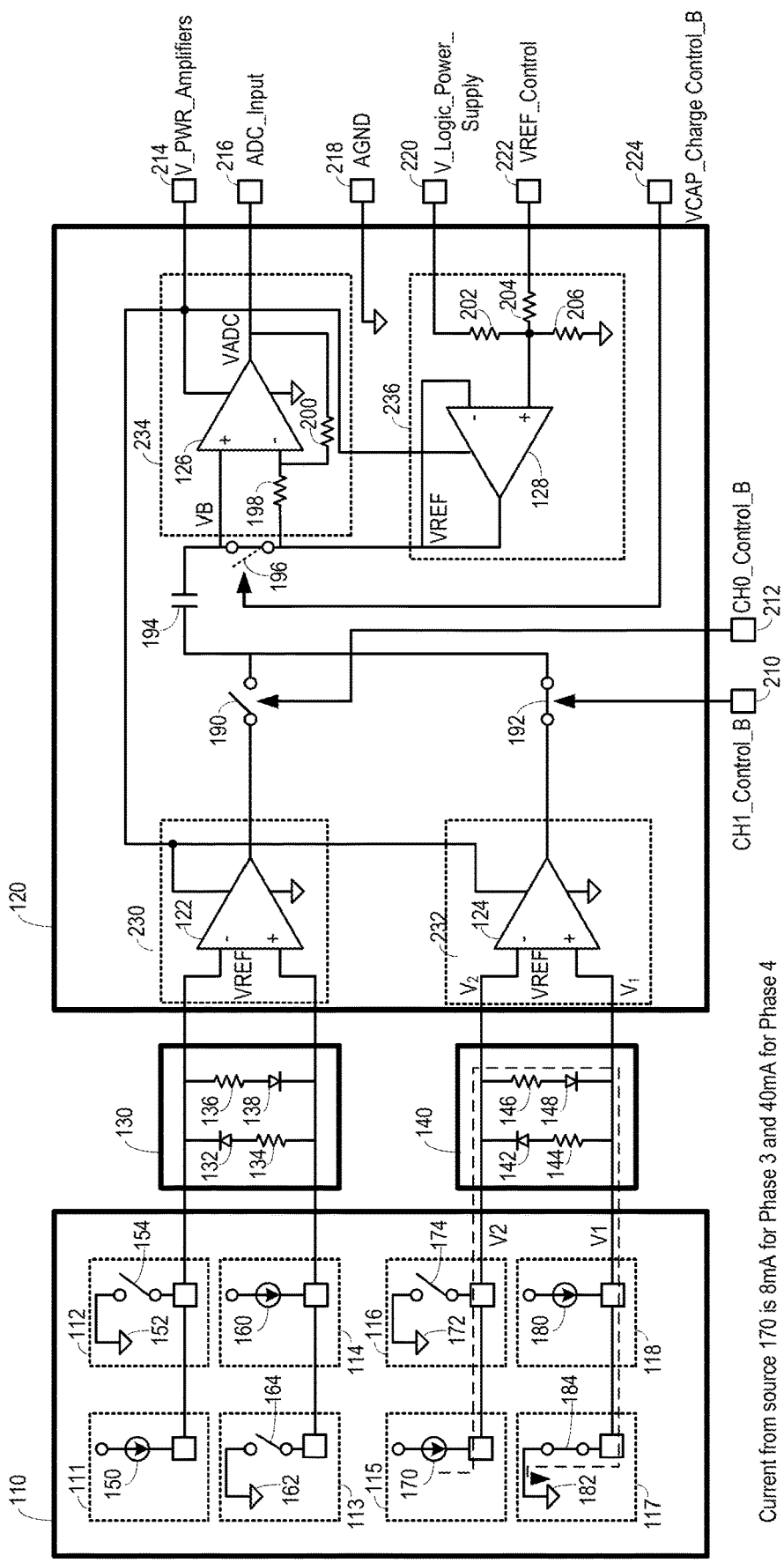
FIG. 6 is a schematic view of a system including a delta difference amplifier performing a third and fourth phase of a diagnostic for a second channel.

FIG. 6 is a schematic view of a system including a delta difference amplifier performing a third and fourth phase of a diagnostic for a second channel. When testing the second polarity of duplex squib load 140, the current source 180 may be activated to provide at least two diagnostic currents (e.g. 8 mA in phase 3 and then 40 mA in phase 4) to the squib load 140. The diagnostic currently may flow from the current source 180 to resistor 144 of the duplex squib load 140. The current may flow through resistor 144 and diode 142 generating a voltage drop. The current may not flow through diode 148 and resistor 146, since the polarity of diode 148 would operate to block the current flow from current source 180. The current would flow from diode 142, through switch 174 to the ground 172. Accordingly, when current source 180 is activated, switch 174 may be closed. At the same time, switch 184 may be open to isolate current source 180 from ground 182 directly. The voltage drop across resistor 144 and diode 142 may be provided as an input to measurement amplifier 124.

In this scenario, the output of amplifier 124 may be provided to switch 192. Control signal 210 may be active to cause switch 192 to close, providing the output of amplifier 124 to capacitor 194. At the same time, control signal 212 may be deactivated causing switch 190 to open, isolating the output of amplifier 122 from capacitor 194.

Capacitor 194 may take out the DC component of the output from amplifier 124 and provide the signal to an input of gain amplifier 126. The negative input of gain amplifier 126 may be connected to the output of reference amplifier 128 through resistor 198. The negative input of gain amplifier 126 may also be connected to the output of gain amplifier 126 in a feedback loop through resistor 200. The output of gain amplifier 126 may be provided to terminal 216 as the measurement output for diagnostic purposes.

The negative input of reference amplifier 128 may be directly connected to the output of reference amplifier 128. The positive input of reference amplifier 128 may be connected to a resistor network. As such, the positive input of reference amplifier 128 may be connected to a logic power supply terminal 220 through resistor 202. The positive input of reference amplifier 128 may be connected to reference control voltage terminal 222 through resistor 204. Additionally, the positive input of reference amplifier 128 may be connected to an electrical ground through resistor 206.

Power for the amplifiers 122, 124, 126, and 128 may be provided on terminal 214. The ground for the delta difference amplifier may be provided on terminal 218. In addition, the capacitor charge control signal may be provided on terminal 214 to activate or deactivate switch 196, thereby setting one side of capacitor 194 to voltage at the output of reference amplifier 128.

Figure 7:
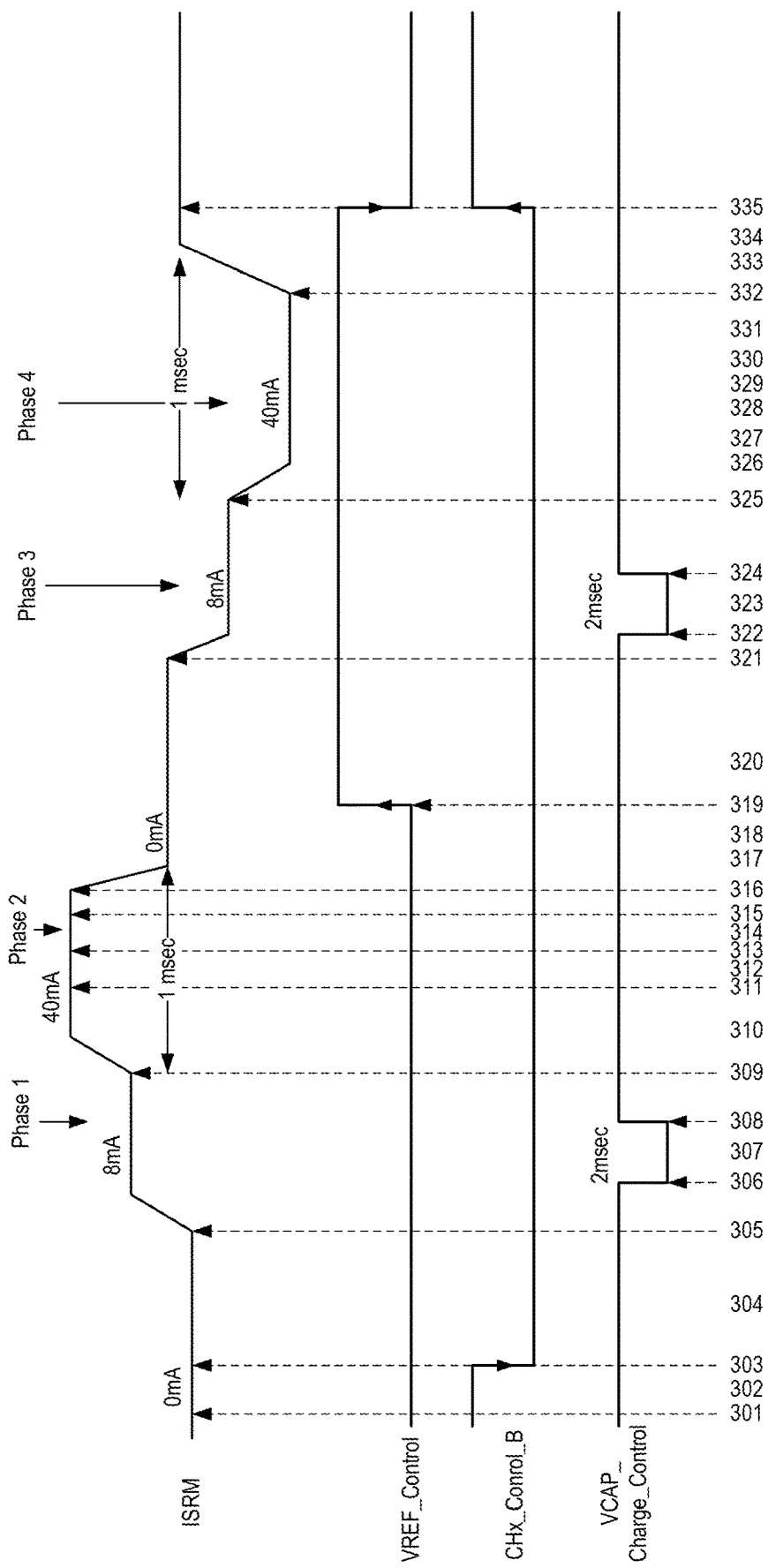
FIG. 7 is a timing diagram illustrating the method of diagnosing the squib circuit.

FIG. 7 is a timing diagram illustrating the method of diagnosing the squib circuit. At 301, the control signals set VREF_Control=0V (VREF=Low_level); set CH2_Control_B=5V(Disable CH2); set CH1_Control_B=5V(Disable CH1); set CH0_Control_B=5V (Disable CH0); and set V_Charge Cap Control=5V(Disable).

At 302, the control signals delay 2 msec (VREF Settle Time).

At 303, the control signals set CH2_Control_B=1 (Disable CH2); set CH1_Control_B=1 (Disable CH1); and set CH0_Control_B=0 (Disable CH0).

At 304, the control signals delay 100 usec (Mux SW Settle Time).

At 305, the control signals activate via SPI 10 mA squib resistance measurement (SRM) on CH0.

At 306, the control signals set V Charging Cap Control=0V (Enable Cap).

At 307, the control signals delay 2 msec (Charging Settle Time).

At 308, the control signals set V_Charge_Cap_Control=5V stop and charging and hold to 8 mA voltage level.

At 309, the control signals activate via SPI 40 mA SRM on CH0.

At 310, the control signals delay 250 usec.

At 311, the control signals measure the voltage VADC using the analog to digital converter (ADC).

At 312, the control signals delay 250 usec.

At 313, the control signals measure VADC using the ADC.

At 314, the control signals delay 250 usec.

At 315, the control signals measure VADC using the ADC.

At 316, the control signals de-activate via SPI 40 mA SRM on CH0

At 317, the controller calculates SRM DUPLEX CH-ASIC.

At 318, the control signals delay 250 usec (delay for ASIC to disable SRM on Source CH0.

At 319, the control signals set WREF_Control=5V (WREF=High_Level).

At 320, the control signals delay 2 msec (VREF Settle Time).

At 321, the control signals activate via SPI 8 mA SRM on.

At 322, the control signals set V_Charging_Cap_Control=0V (Enable Cap)

At 323, the control signals delay 2 msec (Charging Settle Time).

At 324, the control signals set V_Charge_Cap_Contrl=5V Stop Charging and Hold to 10 mA Voltage Level (Mux SW off).

At 325, the control signals activate via SPI 40 mA SRM on CH1.

At 326, the control signals delay 250 usec.

At 327, the control signals measure VADC using the ADC.

At 328, the control signals delay 250 usec.

At 329, the control signals measure VADC using the ADC.

At 330, the control signals delay 250 usec.

At 331, the control signals measure VADC using the ADC.

At 332, the control signals de-activate via SPI 40 mA SRM on CH0

At 333, the control signals calculate SRM DUPLEX CH0 ASIC CH1.

At 334, the control signals delay 250 usec (delay for ASIC to disable SRM on Source CH1.

At 335, the control signals set WREF_Control=0V (VREF=Low_Level); set CH2_Control_B=5V(Disable CH2); set CH1_Control_B=5V(Disable CH1); set CH0_Control_B=5V(Disable CH0); set V Charge Cap Control=5V(Disable).

The mathematics of the resulting voltages for each phase are provided below.

Phase 1:
VREF=0, 8 mA Delivered to V1, 8 mA returned via V2, SW1=on, SW2=on. SW1 is switch 190 and SW2 is switch 196. Where V1 is the voltage on the positive input of amplifier 122 and V2 is the voltage on the negative input of amplifier 122. VREF is the voltage on the output of amplifier 128. VA is the voltage on the output of amplifier 122. R1DA and R2DA are the resistance values in the difference amplifier block, for example as shown in FIG. 8. R1OA is the resistance of resistor 198 and R2OA is the resistance of resistor 200. VB is the voltage on the positive input of amplifier 126. VC is VREF. VADC is the voltage on the output of amplifier 126. Rsquib*8 mA is (Resistor 134)*(Current source 160 value=8 mA) and Rsquib*40 mA is (Resistor 134)*(current source 160 value=40 mA)

At DiffAMP $$V1-V2=(\text{Rsquib}*8mA)$$

$$VA=(V1-V2)*(R2DA/R1DA)+VREF$$

$$VA=(\text{Rsquib}*8mA)*(R2DA/R1DA)+VREF$$

$$VCAP=VA-VC$$

$$VCAP=[(\text{Rsquib}*8mA)*(R2DA/R1DA)+VREF]-VREF$$

$$VCAP=[(\text{Rsquib}*8mA)*(R2DA/R1DA)]$$

At OUTPUTAMP $$VADC\_1=VB*(1+(R2OA/R1OA))-VREF*(R2OA/R1OA)$$

$$VB=VREF$$

$$VADC\_1=VREF*(1+(R2OA/R1OA))-VREF*(R2OA/R1OA)$$

$$VADC\_1=VREF$$

Phase 2:
VREF=0, 40 mA Delivered to V1, 40 mA returned via V2, SW1=on, SW2=off

At DiffAMP $$V1-V2=(\text{Rsquib}*40mA)$$

$$VA=(V1-V2)*(R2DA/R1DA)+VREF$$

$$VA=(\text{Rsquib}*40mA)*(R2DA/R1DA)+VREF$$

At OUTPUTAMP $$VADC\_2=VB*(1+(R2OA/R1OA))-VREF*(R2OA/R1OA)$$

$$VB=VA-VCAP$$

$$VCAP=(\text{Rsquib}*8mA)*(R2DA/R1DA)$$

$$VB=[(\text{Rsquib}*40mA)*(R2DA/R1DA)+VREF]-[(\text{Rsquib}*8mA)*(R2DA/R1DA)]$$

$$VADC\_2=[VB*(1+(R2OA/R1OA))-VREF*(R2OA/R1OA)]-$$

$$VADC\_2=[[[[(\text{Rsquib}*40mA*(R2DA/R1DA)]+VREF]-[\text{Rsquib}*8mA)(R2DA/R1DA)]]*(1+(R2DA/R1DA))]-VREF*(R2OA/R1OA)$$

$$[[[(\text{Rsquib}*40mA)-(\text{Rsquib}*8mA))*(R2DA/R1DA)]+VREF]*(1+(R2OA/R1OA))]+VREF*(R2OA/R1OA)$$

$$[((\text{Rsquib}*40mA)-(\text{Rsquib}*8mA))*(R2DA/R1DA)*(1+(R2OA/R1OA))]+VREF*(1+(R2OA/R1OA))-VREF*(R2OA/R1OA)$$

$$[((Rsquib*40mA)-(Rsquib*8mA))*(R2DA/R1DA)*(1+(R2OA/R1)A))]+VREF$$

$$VDAC\_1=VREF$$

So Delta Vout yields:

$$\text{Delta difference}=VADC\_2-VADC\_1= \\ [((Rsquib*40mA)-(Rsquib*8mA))*(R2DA/R1DA)*(1+(R2OA/R1OA))]+VREF$$

$$\text{Delta difference}=VADC\_2-VADC\_1= \\ [((Rsquib*40mA)-(Rsquib*8mA))*(R2DA/R1DA)*(1+(R2OA/R1OA))]+0$$

$$\text{Delta difference}=VADC\_2-VADC\_1= \\ [((Rsquib*40mA)-(Rsquib*8mA))*(R2DA/R1DA)*(1+(R2OA/R1OA))]$$

Finally solving for the term Rsquib yields:

$$RSquib=\text{Delta difference}/[(40mA-8\ mA)*(R2DA/R1DA)*(1+(R2OA/R1OA))]$$

$$RSquib=(VADC\_2-VADC\_1)/[(40mA-8\ mA)*(R2DA/R1DA)*(1+(R2OA/R1OA))]$$

Phase 3:
VREF=5, 8 mA Delivered to V2, 8 mA returned via V1, SW1=on, SW2=on.
At DiffAMP $$V1-V2=-(Rsquib*8mA)$$

$$VA=(V1-V2)*(R2DA/R1DA)+VREF$$

$$VA=-(Rsquib*8mA)*(R2DA/R1DA)+VREF$$

$$VCAP=VREF-VA$$

$$VCAP=VREF-[[-(Rsquib*8mA)*(R2DA/R1DA)]+VREF]$$

$$VCAP=[(Rsquib*8mA)*(R2DA/R1DA)]$$

At OUTPUTAMP $$VADC\_1=VB*(1+(R2OA/R1OA))-VREF*(R2OA/R1OA)$$

$$VB=VREF$$

$$VADC\_1=VREF*(1+(R2OA/R1OA))-VREF*(R2OA/R1OA)$$

$$VDAC\_1=VREF$$

Phase 4:
VREF=5, 40 mA Delivered to V2, 40 mA returned via V1, SW1=on, SW2=off
At DiffAMP $$V1-V2=-(Rsquib*40mA)$$

$$VA=(V1-V2)*(R2DA/R1DA)+VREF$$

$$VA=(-Rsquib*40mA)*(R2DA/R1DA)+VREF$$

At OUTPUTAMP $$VADC\_2=VB*(1+(R2OA/R1OA))-VREF*(R2OA/R1OA)$$

$$VB=VA+VCAP$$

$$VCAP=(Rsquib*8mA)*(R2DA/R1DA)$$

$$VB=[(Rsquib*40mA)*(R2DA/R1DA)+VREF]-[(Rsquib*8mA)*(R2DA/R1DA)]$$

$$VADC\_2=[[[[-(Rsquib*40mA)*(R2DA/R1DA)]+VREF]+[(Rsquib*8mA*(R2DA/R1DA)]]]*(1+(R2OA/R1OA))]-VREF*(R2OA/R1OA)$$

$$VADC\_2=[[[[(Rsquib*8mA)-(Rsquib*40mA)*(R2DA/R1DA)]+VREF]*(1+(R2OA/R1OA))]-VREF*(R2OA/R1OA)$$

$$VADC\_2=[(Rsquib*8mA)-(Rsquib*40mA)*(R2DA/R1DA)*(1+(R2OA/R1OA))]+VREF*(1+(R2OA/R1OA))]-VREF*(R2OA/R1OA)$$

$$VADC\_2=[(Rsquib*8mA)-(Rsquib*40mA)*(R2DA/R1DA)*(1+(R2OA/R1OA))]+VREF$$

$$VDAC1=VREF$$

So Delta Vout yields:

$$\text{Delta difference}=VADC\_1-VADC\_2=VREF-[[((Rsquib*8mA)-(Rsquib*40mA))*(R2DA/R1DA)*(1+(R2OA/R1OA))]+VREF]$$

$$\text{Delta difference}=VADC\_1-VADC\_2=-[((Rsquib8mA)-(Rsquib*40mA))*(R2DA/R1DA)*(1+(R2OA/R1OA))]$$

$$\text{Delta difference}=VADC\_1-VADC\_2=[((Rsquib*40mA)-(Rsquib*8mA))*(R2DA/R1DA)*(1+(R2OA/R1OA))]$$

Finally solving for the term Rsquib yields:

$$RSquib=\text{Delta difference}/[(40mA-8\ mA)*(R2DA/R1DA)*(1+(R2OA/R1OA))]$$

$$RSquib=(VADC\_2-VADC\_1)/[(40mA-8\ mA)*(R2DA/R1DA)*(1+(R2OA/R1OA))]$$

For a current applied to V1 and returned on V2

$$VADC\_1=VREF=0V$$

$$\text{Delta difference}=VADC\_2-VADC\_1=[((Rsquib*40mA)-(Rsquib*8mA))*(R2DA/R1DA)*(1+(R2OA/R1OA))]$$

For a current applied to V2 and returned on V1

$$VADC\_1=VREF=5V$$

$$\text{Delta difference}=VADC\_1-VADC\_2=-[((Rsquib(40mA)-(Rsquib*8mA))*(R2DA/R1DA)*(1+(R2OA/R1OA))]$$

For Difference Amplifier: R1DA=R2DA so unity Gain is achieved.

Figure 8A:
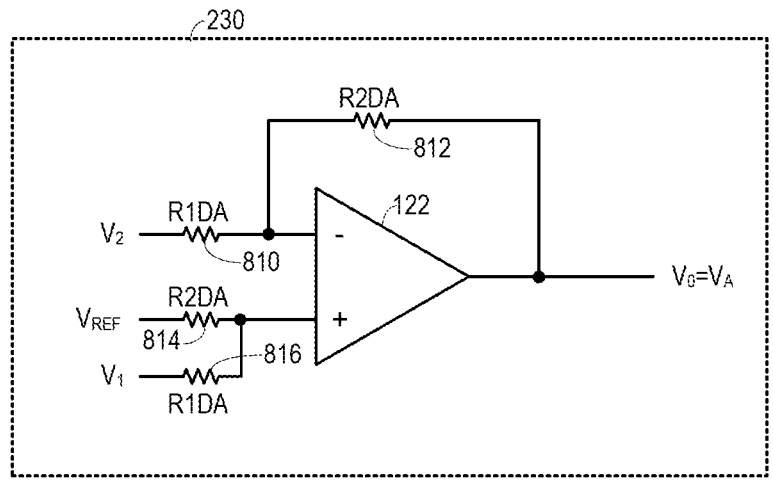
FIGS. 8a and 8b are schematic diagrams illustrating one implementation of the difference amplifier blocks.

FIG. 8a is a schematic view of one implementation of the difference amplifier block 230. The voltage V2 may be provided to the negative input of amplifier 122 through resistor 810. The negative input of amplifier 122 may be connected to the output of amplifier 122 through resistor 812. The voltage VREF may be provided to the positive input of amplifier 122 through resistor 814 and voltage V1 may be provided to the positive input of amplifier 122 through resistor 816. Resistors 810 and 816 may have the value R1DA and resistors 812 and 814 may have the value of R2DA.

Figure 8B:
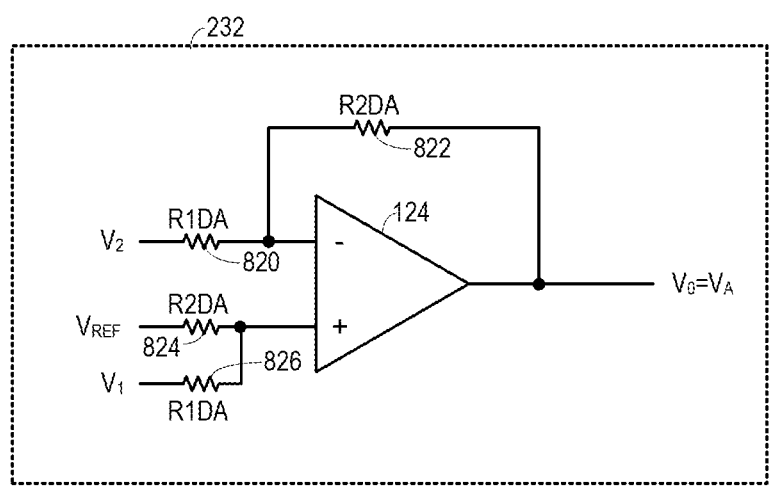

FIG. 8b is a schematic view of one implementation of the difference amplifier block 232. The voltage V2 may be provided to the negative input of amplifier 122 through resistor 820. The negative input of amplifier 122 may be connected to the output of amplifier 122 through resistor 822. The voltage VREF may be provided to the positive input of amplifier 122 through resistor 824 and voltage V1 may be provided to the positive input of amplifier 122 through resistor 826. Resistors 820 and 826 may have the value R1DA and resistors 822 and 824 may have the value of R2DA.

The equations showing the calculation of the output of the difference amplifier blocks 230 and 232 are provided below.

$$V+ = V_1\left(\frac{R2DA}{R1DA + R2DA}\right) + V_{ref}\left(\frac{R1DA}{R1DA + R2DA}\right)$$

$$V- = V_2\left(\frac{R2DA}{R1DA + R2DA}\right) + V_0\left(\frac{R1DA}{R1DA + R2DA}\right)$$

$$V+ = V-$$

$$V_1\left(\frac{R2DA}{R1DA + R2DA}\right) + V_{ref}\left(\frac{R1DA}{R1DA + R2DA}\right) =$$

$$V_2\left(\frac{R2DA}{R1DA + R2DA}\right) + V_0\left(\frac{R1DA}{R1DA + R2DA}\right)$$

$$V_0 = V_1\left(\frac{R2DA}{R1DA}\right) - V_2\left(\frac{R2DA}{R1DA}\right) + V_{ref}$$

$$V_A = V_0$$

$$V_A = (V_1 - V_2)\left(\frac{R2DA}{R1DA}\right) + V_{ref}$$

Figure 9A:
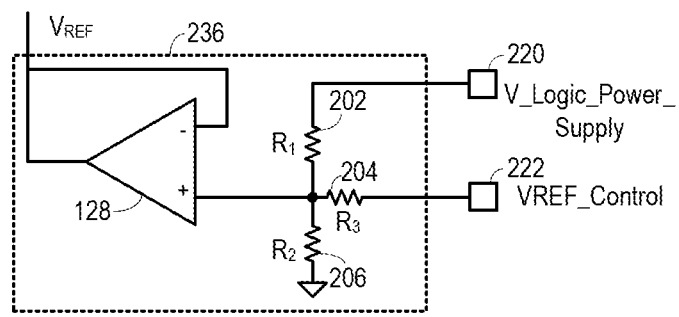
FIG. 9a is schematic diagrams illustrating one implementation of the reference amplifier block.

The equations showing the calculation of the output of the reference amplifier block 236 are provided below. One example, of the reference amplifier block is shown in FIG. 9A. Resistor 202 has the value resistance value $R_1$, Resistor 206 has the resistance value $R_2$, and Resistor 204 has the resistance value $R_3$.

$$V_{ref} = V_{Ref\_control}\left(\frac{R_1 \| R_2}{R_3 + (R_1 \| R_2)}\right)R + V_{Logic\ Supply\ Power}\left(\frac{R_3 \| R_2}{R_1 + (R_3 \| R_2)}\right)$$

$$V_{ref} = V_{Ref\_control}\left(\frac{\frac{R_1 * R_2}{R_1 + R_2}}{R_3 + \frac{R_1 * R_2}{R_1 + R_2}}\right)R + V_{Logic\ Supply\ Power}\left(\frac{\frac{R_3 * R_2}{R_3 + R_2}}{R_1 + \frac{R_3 * R_2}{R_3 + R_2}}\right)$$

In one example, R1, R2, and R3 may, for example, have the values provided below.

$$R_1 = 76.8k$$

$$R_2 = 69.8k$$

$$R_3 = 4.32k$$

$$V_{ref} = V_{Ref\_control} * (0.894) + V_{Logic\ Supply\ Power}(0.05)$$

$$V_{ref@0V} = \emptyset(0.894) + 5V(0.05) = 0.25V \sim 0V$$

$$V_{ref@5V} = 5V(0.894) + 5V(0.05) = 4.72V \sim 5V$$

Figure 9B:
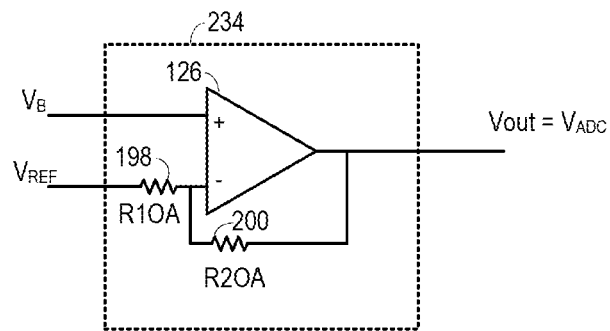
FIG. 9b is schematic diagrams illustrating one implementation of the output amplifier block.

The equations showing the calculation of the output of the output amplifier block 234 are provided below. One example, of the output amplifier block is shown in FIG. 9B. Resistor 198 has the resistor value R1OA and resistor 200 has the resistor value of R2OA.

$$V+ = V_B$$

$$V- = V_{Ref}\left(\frac{R20A}{R10A + R20A}\right) + V_{out}\left(\frac{R10A}{R10A + R20A}\right)$$

-continued $$V+ = V-$$

$$V_B = V_{Ref}\left(\frac{R20A}{R10A + R20A}\right) + V_{out}\left(\frac{R10A}{R10A + R20A}\right)$$

$$V_{out} = \left[V_B - V_{ref}\left(\frac{R20A}{R10A + R20A}\right)\right]\left[\frac{R10A + R20A}{R10A}\right]$$

$$V_{ADC} = V_{out}$$

$$V_{ADC} = \left[V_B\left(1 + \frac{R20A}{R10A}\right) - V_{ref}\left(\frac{R20A}{R10A}\right)\right]$$

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

As a person skilled in the art will readily appreciate, the above description is meant as an illustration of the principles of this disclosure. This description is not intended to limit the scope or application of this disclosure in that the systems and methods are susceptible to modification, variation and change, without departing from spirit of this disclosure, as defined in the following claims.

The invention claimed is:

1. A system for diagnosing a squib loop in a restraint control module, the system comprising:
a first amplifier having a first input connected to a first side of a squib load and a second input connected to a second side of the squib load, an output of the first amplifier generating an output voltage corresponding to a voltage drop across the squib load;
a capacitor in series with the output of the first amplifier, the output of the first amplifier being connected to a first side of the capacitor; and
a second amplifier having a first input connected to a second side of the capacitor, a second input of the second amplifier is connected to a reference voltage, the second amplifier being configured with a feedback loop to generate a gain output.

2. The system according to claim 1, further comprising an analog to digital converter in communication with an output of the second amplifier to receive the gain output.

3. The system according to claim 1, further comprising a switch between the output of the first amplifier and the capacitor configured to connect and isolate the output from the capacitor.

4. The system according to claim 1, further comprising a first current source in communication with a first side of the squib load to provide a diagnostic current.

5. The system according to claim 4, further comprising a first switch in communication with second side of the squib load and configured to provide a connection to ground.

6. The system according to claim 4, further comprising a second current source in communication with the second side of the squib load to provide a diagnostic current.

7. The system according to claim 6, further comprising a second switch in communication with first side of the squib load and configured to provide a connection to ground.

8. The system according to claim 4, wherein the first current source provides a first current and a second current for measurement, the second current being at least twice the first current.

9. The system according to claim 8, wherein the second current is at least five times the first current.

10. The system according to claim 9, wherein the first current is approximately 8 mA.

11. The system according to claim 10, wherein the second current is approximately 40 mA.

12. The system according to claim 1, further comprising a third amplifier, an output of the third amplifier being connected to the second input of the second amplifier.

13. The system according to claim 12, wherein a first input of the third amplifier being connected to the output of the third amplifier.

14. The system according to claim 12, wherein an output of the third amplifier is connected to reference voltage through a first resistor and a ground through a second resistor.

15. A method for diagnosing a squib circuit, the method comprising the steps of:
activating a first current source to provide a first current to a squib load in a first direction,
measuring a first voltage drop across the squib load using a difference amplifier comprising a first amplifier with a first input and second input at opposite sides of the squib load, an output of the first amplifier being in communication with an input of a second amplifier through a capacitor, an output of the second amplifier being connected to an analog to digital converter for acquiring measurements;
activating the first current source to provide a second current to the squib load in the first direction;
measuring a second voltage drop across the squib load through the difference amplifier;
activating a second current source to provide a third current to the squib load in a second direction;
measuring a third voltage drop across the squib load using through the difference amplifier;
activating a second current source to provide a fourth current to the squib load in the second direction; and
measuring a fourth voltage drop across the squib load using through the difference amplifier.

16. The method according to claim 15, further comprising connecting the output of the first amplifier to the current source before the activating the first current source.

17. The method according to claim 15, further comprising providing a reference voltage to a second input of the second amplifier.

18. The method according to claim 15, further comprising connecting the first input of the second amplifier to a reference voltage.

19. A difference amplifier for diagnosing a squib loop in a restraint control module, the difference amplifier comprising:
a first amplifier having a first input connected to a first side of a squib load and a second input connected to a second side of the squib load, an output of the first amplifier generating an output voltage corresponding to a voltage drop across the squib load;
a capacitor in series with the output of the first amplifier, the output of the first amplifier being connected to a first side of the capacitor;
a switch between the output of the first amplifier and the capacitor configured to connect and isolate the output from the capacitor;
a second amplifier having a first input connected to a second side of the capacitor, a second input of the second amplifier is connected to a reference voltage, the second amplifier being configured with a feedback loop to generate a gain output; and
an analog to digital converter in communication with an output of the second amplifier to receive the gain output.

20. The difference amplifier according to claim 19, further comprising a third amplifier, an output of the third amplifier being connected to the second input of the second amplifier to provide a reference voltage.

* * * * *